United States Patent
Eder et al.

(10) Patent No.: US 8,637,379 B2
(45) Date of Patent: Jan. 28, 2014

(54) DEVICE INCLUDING A SEMICONDUCTOR CHIP AND A CARRIER AND FABRICATION METHOD

(75) Inventors: Hannes Eder, Villach (AT); Ivan Nikitin, Regensburg (DE); Manfred Schneegans, Vaterstetten (DE); Jens Goerlich, Bueren (DE); Karsten Guth, Soest (DE); Alexander Heinrich, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 280 days.

(21) Appl. No.: 12/575,532

(22) Filed: Oct. 8, 2009

(65) Prior Publication Data

US 2011/0084369 A1    Apr. 14, 2011

(51) Int. Cl.
*H01L 21/00* (2006.01)
*H01L 21/30* (2006.01)
*H01L 21/46* (2006.01)
*H01L 21/44* (2006.01)
*H01L 21/50* (2006.01)
*H01L 21/60* (2006.01)

(52) U.S. Cl.
USPC ........... 438/455; 438/119; 438/458; 438/612; 257/E21.499; 257/E21.516

(58) Field of Classification Search
USPC ................. 438/106–109, 110, 113, 458, 612, 438/118–119, 455
See application file for complete search history.

(56) References Cited

U.S. PATENT DOCUMENTS

| | | | |
|---|---|---|---|
| 5,786,633 A | 7/1998 | Wolfgang et al. | |
| 6,069,024 A | 5/2000 | Murakami | |
| 6,143,116 A | 11/2000 | Hayashi et al. | |
| 6,323,458 B1 | 11/2001 | Nomura et al. | |
| 6,507,105 B1 | 1/2003 | Yamagata et al. | |
| 6,727,117 B1 | 4/2004 | McCoy | |
| 6,863,209 B2 | 3/2005 | Rinne et al. | |
| 7,083,850 B2 | 8/2006 | Rasiah | |
| 2002/0053735 A1 | 5/2002 | Neuhaus et al. | |
| 2002/0060361 A1* | 5/2002 | Sasaki | 257/698 |
| 2002/0090756 A1* | 7/2002 | Tago et al. | 438/108 |
| 2002/0192867 A1* | 12/2002 | Nishiyama | 438/110 |
| 2003/0146497 A1 | 8/2003 | Abbott et al. | |
| 2005/0110161 A1 | 5/2005 | Naito et al. | |
| 2006/0154103 A1 | 7/2006 | Riedl et al. | |
| 2006/0281309 A1* | 12/2006 | Trezza | 438/675 |
| 2007/0025684 A1 | 2/2007 | Otremba | |
| 2007/0181987 A1 | 8/2007 | Hong et al. | |
| 2008/0073776 A1 | 3/2008 | Suh et al. | |
| 2009/0162557 A1* | 6/2009 | Lu et al. | 427/383.3 |

FOREIGN PATENT DOCUMENTS

| | | |
|---|---|---|
| DE | 102006037198 | 2/2008 |
| JP | 20023/63614 | 6/2001 |
| WO | WO00/13823 | 3/2000 |
| WO | WO2004/044950 | 5/2004 |
| WO | WO2005/079353 | 9/2005 |

\* cited by examiner

*Primary Examiner* — Calvin Choi
(74) *Attorney, Agent, or Firm* — Dicke, Billig, Czaja, PLLC (57) ABSTRACT

A description is given of a method. In one embodiment the method includes providing a semiconductor chip with semiconductor material being exposed at a first surface of the semiconductor chip. The semiconductor chip is placed over a carrier with the first surface facing the carrier. An electrically conductive material is arranged between the semiconductor chip and the carrier. Heat is applied to attach the semiconductor chip to the carrier.

20 Claims, 6 Drawing Sheets

DEVICE INCLUDING A SEMICONDUCTOR CHIP AND A CARRIER AND FABRICATION METHOD

BACKGROUND

This invention relates to a device including a semiconductor chip and a carrier and a method of fabricating thereof.

Electronic devices may include carriers on which semiconductor chips may be mounted. Furthermore, electronic devices may include materials to attach the semiconductor chips to the carriers. These materials may be electrically conductive so as to provide an electrical coupling between the semiconductor chips and the carriers.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, memory circuits or integrated passives. Furthermore, the semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have electrodes in one embodiment on its two main surfaces, that is to say on its top side and bottom side. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips may be fabricated on a wafer made of semiconductor material. The surface area of a semiconductor wafer may be standardized according to predetermined wafer diameters, e.g., 4 inches, 8 inches, 10 inches or 12 inches. The thickness of the semiconductor wafer may vary within ranges of typically 10 to 1000 μm, where these values may also be smaller or larger in specific applications. The semiconductor wafers may be thinned, for example by grinding their backsides, down to a thickness in the range from 10 to 220 μm. The semiconductor wafers may be diced thereby separating the individual semiconductor chips.

The semiconductor chips may have electrodes (or contact pads) which allow electrical contact to be made with the integrated circuits included in the semiconductor chips. One or more metal layers may be applied to some electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

Some of the electrodes may not be covered with metal layers. At these electrodes semiconductor material, for example Si, SiC, SiGe or GaAs, may be exposed. It may be provided that an entire surface of the semiconductor chip, for example the backside of the semiconductor chip or any other surface, is not coated with any metal layer. These electrodes or surfaces of the semiconductor chips may be used to attach the semiconductor chips to carriers. The electrodes or surfaces of the semiconductor chips which are not covered with metal layers may further be free of semiconductor oxide material when the semiconductor chips are attached to the carriers.

The carriers may be of any shape, size or material. During the fabrication of the devices the carriers may be connected to each other. The carriers may also be made from one piece. The carriers may be connected among each other by connection means with the purpose of separating the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in one embodiment copper, copper alloys, iron nickel, aluminum, aluminum alloys, or other appropriate materials. The carriers may be made solely of metals or metal alloys. The carriers may be, for example, leadframes or parts of leadframes. Furthermore, the carriers may be plated with an electrically conductive material, for example copper, silver, iron nickel or nickel phosphorus. Carriers consisting of electrically insulating material and having at least one electrically conductive surface may also be employed. A DBC (Direct Bonded Copper) substrate is an example of such a carrier. A DBC substrate is composed of a ceramic carrier with a sheet of copper bonded to one or both sides of the ceramic carrier.

An electrically conductive material may be used to attach the semiconductor chips to the carriers. Furthermore, the electrically conductive material may provide an electrical and thermal coupling between the semiconductor chips and the carriers. The electrically conductive material may, for example, be a solder material. Moreover, the electrically conductive material may consist of metal particles. At least some of the metal particles may have dimensions smaller than 100 nm. In order to attach the semiconductor chips to the carriers the metal particles may be heated. When heating the metal particles they may be sintered.

The devices described below may include external contact elements, which may be of any shape and size. The external contact elements may be accessible from outside the devices and may thus allow electrical contact to be made with the semiconductor chips from outside the devices. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements may be leads of a leadframe.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

Figure 1A:
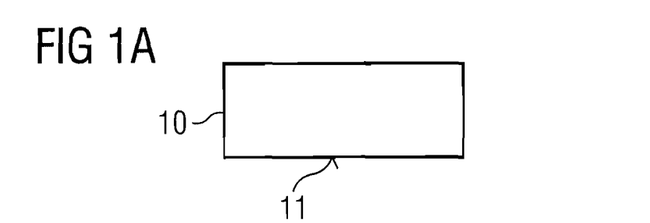
FIGS. 1A to 1C schematically illustrate a cross-sectional view of one embodiment of a method of manufacturing a device including a semiconductor chip attached to a carrier with semiconductor material being exposed at a surface of the semiconductor chip.
Figure 1B:
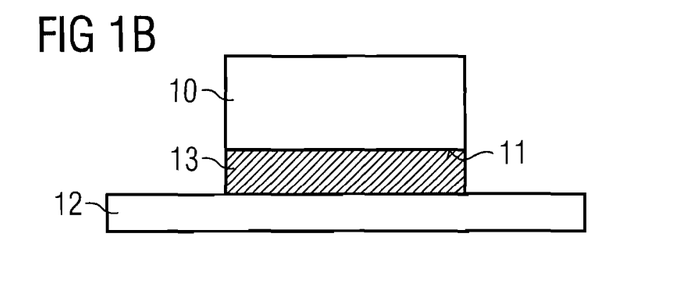
Figure 1C:
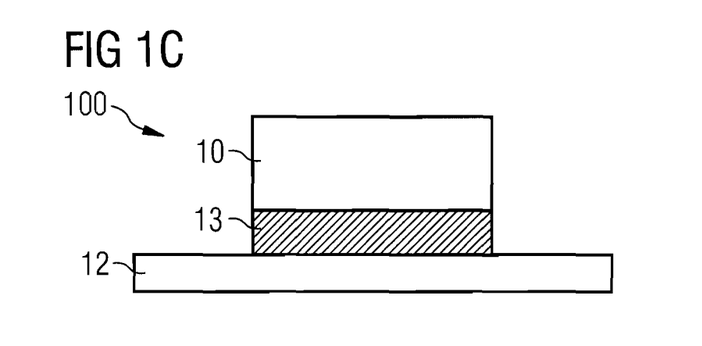

FIGS. 1A to 1C schematically illustrate one embodiment of a method for production of a device 100. A cross section of the device 100 obtained by the method is illustrated in FIG. 1C. First a semiconductor chip 10 is provided (see FIG. 1A). Semiconductor material is exposed at a first surface 11 of the semiconductor chip 10. The semiconductor chip 10 is placed over a carrier 12 such that the first surface 11 of the semiconductor chip 10 faces the carrier 12 (see FIG. 1B). Electrically conductive material 13 is arranged between the semiconductor chip 10 and the carrier 12. Heat is applied in order to attach the semiconductor chip 10 to the carrier 12 (see FIG. 1C).

Figure 2:
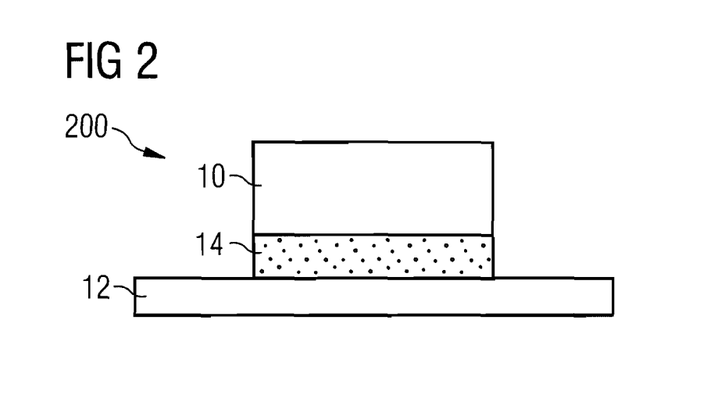
FIG. 2 schematically illustrates a cross-sectional view of one embodiment of a device including a carrier, a sintered metal layer and a semiconductor chip with semiconductor material of the semiconductor chip being in direct contact with the sintered metal layer.

FIG. 2 schematically illustrates a device 200 in cross section. The device 200 includes a carrier 12, a sintered metal layer 14 placed over the carrier 12 and a semiconductor chip 10 placed over the sintered metal layer 14. The sintered metal layer 14 is at least partially in direct contact with semiconductor material of the semiconductor chip 10.

Figure 3A:
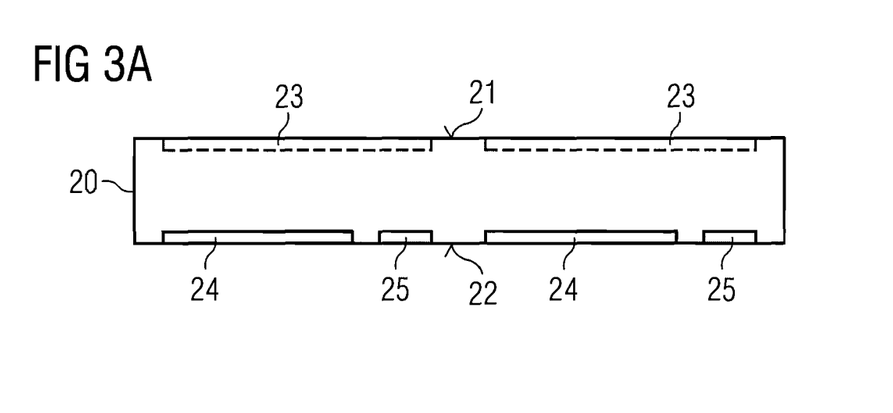
FIGS. 3A to 3I schematically illustrate a cross-sectional view of one embodiment of a method including depositing metal particles on a semiconductor wafer, singulating the semiconductor wafer for obtaining semiconductor chips and attaching the semiconductor chips to carriers.
Figure 3B:
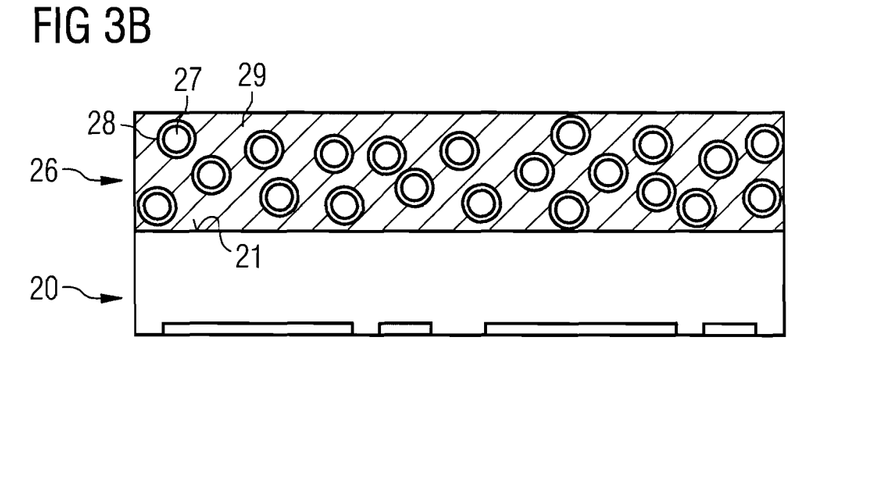
Figure 3C:
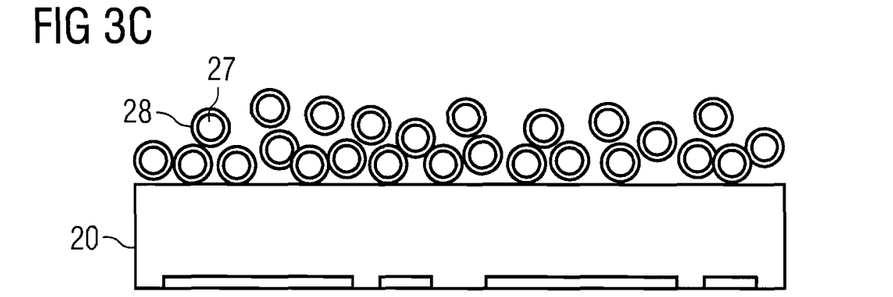
Figure 3D:
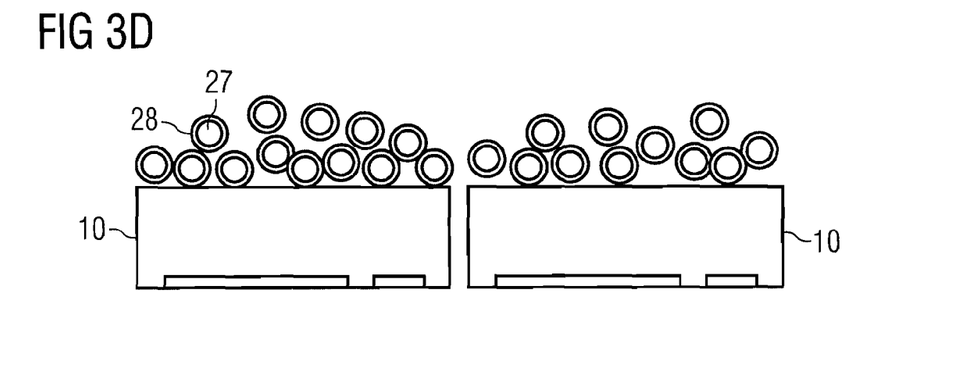
Figure 3E:
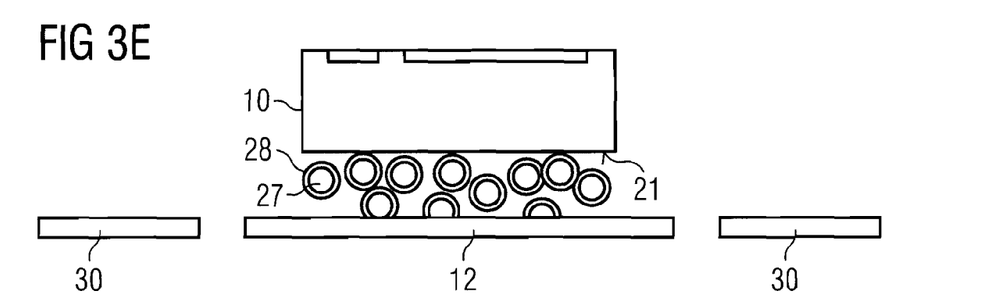
Figure 3F:
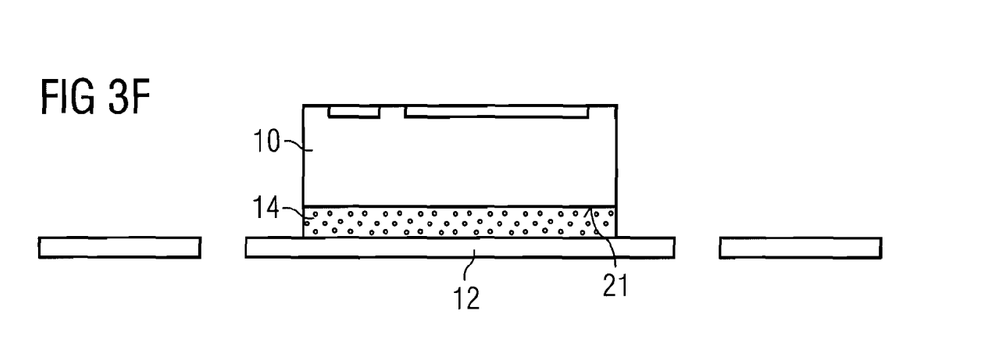
Figure 3G:
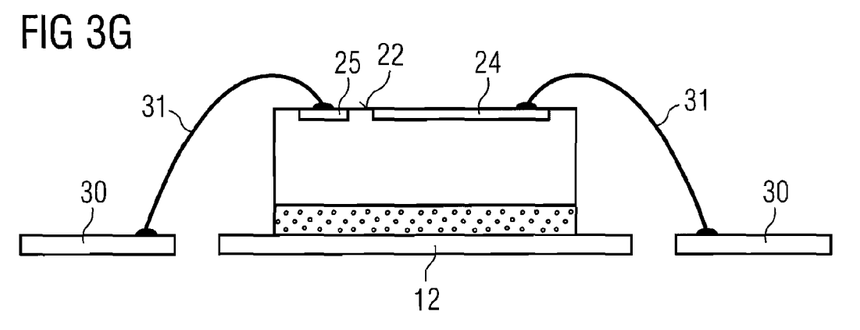
Figure 3H:
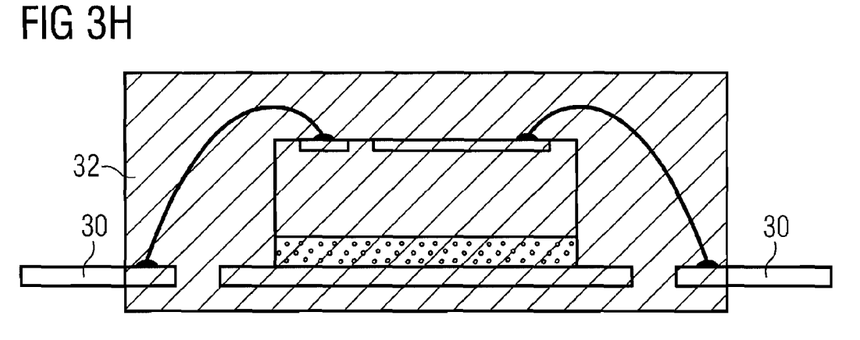
Figure 3I:
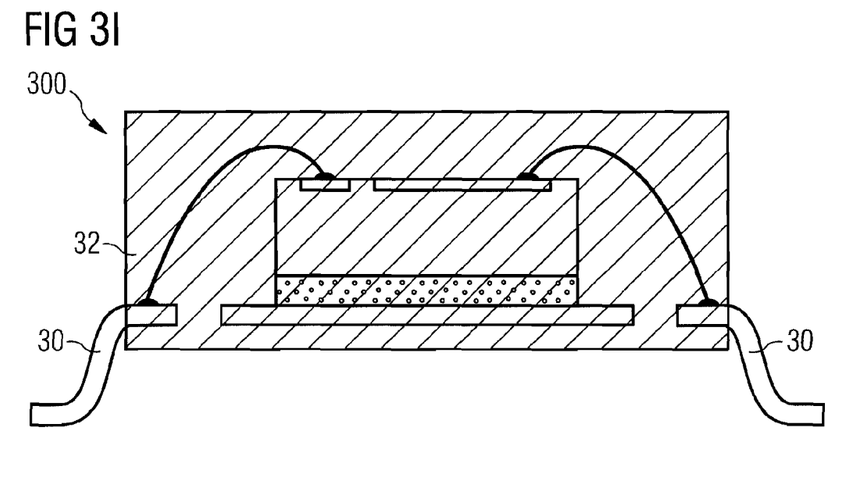

FIGS. 3A to 3I schematically illustrate one embodiment of a method for production of a device 300, a cross section of which is illustrated in FIG. 3I. The device 300 is an implementation of the devices 100 and 200. The details of the device 300 that are described below can therefore be likewise applied to the devices 100 and 200. Furthermore, the method illustrated in FIGS. 3A to 3I is an implementation of the method illustrated in FIGS. 1A to 1C. The details of the production method that are described below can therefore be likewise applied to the method of FIGS. 1A to 1C.

The semiconductor chip 10 as well as all other semiconductor chips described herein may be fabricated on a wafer made of semiconductor material. The semiconductor wafer may have any shape and size and may be manufactured from any semiconductor material. Such a semiconductor wafer 20 is illustrated in FIG. 3A. The semiconductor wafer 20 has a first surface 21 and a second surface 22 opposite to the first surface 21. Semiconductor material may be exposed on the first surface 21 of the semiconductor wafer 20. The first surface 21 may not be coated with any metal layer, instead bare semiconductor material, for example Si, SiC, SiGe or GaAs, may be exposed. The semiconductor material may be doped with appropriate doping ions to obtain an electrical conductivity of at least portions of the first surface 21 of the semiconductor wafer 20. As indicated in FIG. 3A by dashed lines, portions of the first surface 21 of the semiconductor wafer 20 may be doped such that electrodes 23 are produced at the first surface 21. Since manufacturing processes for the metallization of the first surface 21 of the semiconductor wafer 20 are not required, costs for the production of the semiconductor wafer 20 are reduced.

Further electrodes 24 and 25 may be located on the second surface 22 of the semiconductor wafer 20. The electrodes 24 and 25 on the second surface 22 may be coated with one or more metal layers made of aluminum, copper, silver or other metals or metal alloys. The integrated circuits embedded in the semiconductor wafer 20 can be electrically accessed via the electrodes 23 to 25.

The integrated circuits contained in the semiconductor wafer 20 may be physically identical, but may also differ from each other. The integrated circuits may, for example, be vertical power diodes or vertical power transistors, for example IGBTs, JFETs, power bipolar transistors or power MOSFETs. In the latter case, which is exemplarily illustrated in FIG. 3A, the electrodes 23 may be the drain electrodes of the power MOSFETs, and the electrodes 24 and 25 may function as the source and gate electrodes of the power MOSFETs, respectively.

Instead of vertical power diodes or vertical power transistors, other integrated circuits, such as logic circuits, may be contained in the semiconductor wafer 20. In one embodiment those circuits may be embedded in the semiconductor wafer 20 which have an electrode on their backside, first side 21.

The first surface 21 of the semiconductor wafer 20 may be cleaned in an appropriate way, in one embodiment in order to remove any semiconductor oxide material which may be present on the first surface 21. Removing the semiconductor oxide may, for example, be carried out by dipping the semiconductor wafer 20 into a HF solution or by plasma etching with a mixture of argon and hydrogen or by any other appropriate etching method.

After the cleaning process a paste 26 containing metal particles 27 may be applied to the first surface 21 of the semiconductor wafer 20 as illustrated in FIG. 3B. The metal particles 27 may, for example, be made of silver, gold, copper, tin or nickel. According to one embodiment, the metal particles 27 may be made of a pure metal or of a metal alloy. The dimensions (average diameter) of the metal particles 27 may be smaller than 100 nm and, in one embodiment, smaller than 50 nm or 10 nm. It may also be provided that only a fraction of the metal particles 27, which are applied to the semiconductor wafer 20, has such dimensions. For example, at least 10% or 20% or 30% or 40% or 50% or 60% or 70% of the metal particles 27 may have dimensions smaller than 100 nm or 50 nm or 10 nm. The other metal particles 27 may have larger dimensions. According to one embodiment, the metal particles 27 have dimensions in the range between 5 and 50 nm.

The metal particles 27 may be coated with a layer 28 of an organic material or a flux material, for example colophony. Furthermore, the metal particles 27 may be dispersed in a suitable liquid or solvent 29. The paste 26 containing the metal particles 27 may be fluid, viscous or waxy. Pastes containing metal particles, which are coated with a layer of an organic or flux material and dispersed in a solvent, can, for example, be purchased from the companies Coocson Electronic (product name: N 1000), Advanced Nano-Particles (ANP), Harima Chemicals (product names: NPS-H and NHD-1) or NBE Technologies (product name: NBE Tech). Other products from these or other companies may alternatively be used and may serve the same purpose as described below.

The application of the paste 26 containing the metal particles 27 dispersed in the solvent 29 may be performed by stencil printing or other printing technologies. Moreover, the paste 26 may be distributed by a squeegee. Other techniques for the application of the paste 26 to the semiconductor wafer 20 are also possible, for example dispensing or spin-coating.

The solvent 29 may enable the metal particles 27 to be applied to the first surface 21 of the semiconductor wafer 20. Therefore, the solvent 29 may be chosen such that—depending on the application technique—it is fluid, viscous or waxy during the application of the paste 26.

After the application of the paste 26, the paste 26 may be exposed to a moderate temperature $T_1$ in an oven, which may be smaller than 150° C. The exposure time may be arbitrary, in one embodiment it may be long enough to allow the solvent 29 to at least partially evaporate leaving the metal particles 27 localized on the semiconductor wafer 20 as illustrated in FIG. 3C. The solvent 29 may evaporate without any residues. The temperature $T_1$ may be chosen such that the layers 28 coating the metal particles 27 do not melt, in one embodiment if the diameter of the metal particles 27 is smaller than 50 nm or 10 nm. According to one embodiment, the layers 28 may at least partially melt or evaporate at the temperature $T_1$.

The layers 28 coating the metal particles 27 may prevent premature agglomeration of the metal particles 27. Furthermore, the layer of metal particles 27 covering the semiconductor wafer 20 and in one embodiment the layers 28 may prevent oxidation of the bare semiconductor surface 21 of the semiconductor wafer 20.

After the evaporation of the solvent 29, the semiconductor wafer 20 may be diced thereby separating the individual semiconductor chips 10 as illustrated in FIG. 3D. Singulating the semiconductor wafer 20 may be carried out by sawing or any other appropriate technique, for example laser ablation, cutting, stamping, milling or etching. Although only two of the semiconductor chips 10 are illustrated in FIG. 3D, any number of semiconductor chips 10 can be obtained from the semiconductor wafer 20.

The layers 28 of organic material or flux material coating the metal particles 27 may ensure that the metal particles 27 adhere sufficiently well to the first surface 21 of the semiconductor wafer 20 and to each other so that at least a sufficient fraction of the metal particles 27 remain on the first surface 21 even after the dicing of the semiconductor wafer 20.

As illustrated in FIG. 3E, at least one of the semiconductor chips 10 may be placed over a carrier 12 with the first surface 21 and the metal particles 27 facing the carrier 12. The carrier 12 may, for example, be a part of a leadframe, such as a die pad as illustrated in FIG. 3E. The leadframe may further include leads 30 and other die pads. The leadframe may be manufactured from a metal or metal alloy, in one embodiment copper, a copper alloy, iron nickel, aluminum, or other electrically conductive materials. Furthermore, the leadframe may be plated with an electrically conductive material, for example copper, silver, iron nickel or nickel phosphorus. The shape of the leadframe is not limited to any size or geometric shape. The leadframe may have been manufactured by punching a metal plate. The die pads and leads of the leadframe may be connected to each other by dams.

In FIG. 3E only one semiconductor chip 10, which is placed over the leadframe, is illustrated. Further semiconductor chips may also be placed over the leadframe. These semiconductor chips may have been fabricated on the same semiconductor wafer 20, but may alternatively have been manufactured on different semiconductor wafers. Furthermore, the semiconductor chips may be physically identical, but may also contain different integrated circuits.

The metal particles 27 may be exposed to a temperature $T_2$, which is high enough that the layers 28 coating the metal particles 27 sublimate or evaporate. Furthermore, the temperature $T_2$ may be lower than the melting temperature of the metal particles 27. After the layers 28 are removed, the metal particles 27 may form a solid layer 14 by sintering due to the temperature $T_2$. The temperature $T_2$ may be in the range from 150 to 500° C., in one embodiment in the range from 180 to 300° C. and may depend on the material and/or the dimensions of the metal particles 27.

For producing the sintered joint, the carrier 12 may be heated by a hot plate to the temperature $T_2$. According to one embodiment, both the carrier 12 and the semiconductor chip 10 may be placed in an oven and heated to an appropriate temperature. A pick-and-place tool may be used capable of picking the semiconductor chip 10 and placing it on the heated carrier 12. During the sintering process the semiconductor chip 10 may be pressed onto the carrier 12 for an appropriate time, for example some seconds or minutes.

The layers 28 coating the metal particles 27 before the sintering process may prevent oxidation of the metal particles 27. If an outer layer of the metal particles 27 is oxidized, a higher temperature $T_2$ would be required to sinter the metal particles 27. Furthermore, the sinter temperature $T_2$ may be reduced by reducing the diameters or dimensions of the metal particles 27. Due to the different thermal expansion coefficients of the semiconductor chip 10 and the carrier 12 a low temperature $T_2$ is desired to reduce the mechanical stress induced into the semiconductor chip 10 by the carrier 12 during the sintering process. As an example, copper of which the carrier 12 may be manufactured has a thermal expansion coefficient of about $17 \times 10^{-6}$/K and silicon has a thermal expansion coefficient of about $3 \times 10^{-6}$/K. Moreover, due to the low temperature $T_2$ diffusion of impurities and metal particles into the semiconductor chip 10 is inhibited.

As illustrated in FIG. 3F, the sintered metal layer 14 mechanically attaches the semiconductor chip 10 to the carrier 12 and electrically and thermally couples the first surface 21 of the semiconductor chip 10 to the carrier 12. Since the first surface 21 of the semiconductor chip 10 may be free of any metal layer (before the attachment to the carrier 12), the sintered metal layer 14 may be in direct contact with the n-type or p-type semiconductor material of the semiconductor chip 10 and thus the electrode 23. The sintered metal layer 14 may be of any thickness, in one embodiment its thickness may be in the range from 1 to 30 µm. Pores may be distributed over the sintered metal layer 14.

After the attachment of the semiconductor chip 10 to the carrier 12, electrical interconnections may be established from the electrodes 24 and 25 of the semiconductor chip 10 to the leads 30. As illustrated in FIG. 3G, these interconnections may be made by wire bonding. For example, ball bonding or wedge bonding may be used as the interconnect technique. One or more bond wires 31 may be attached to electrically couple each of the electrodes 24 and 25 located on the second surface 22 of the semiconductor chip 10 to the leads 30. The bond wires 31 may be made up of gold, aluminum, copper or any other appropriate electrically conductive material. The carrier 12 may be connected to another lead 30 which is not illustrated in FIG. 3G. This lead 30 and the carrier 12 may be made of one piece.

Instead of wire bonding, other interconnect techniques may be used. For example, metallic clips may be placed on the semiconductor chip 10 and the leads 30 in order to establish the electrical connections.

A mold transfer process may be carried out to encapsulate the components arranged on the leadframe with a mold material 32 as illustrated in FIG. 3H. The mold material 32 may encapsulate any portion of the device 300, but leaves at least parts of the leads 30 uncovered. The exposed parts of the leads 30 may be used as external contact elements to electrically couple the device 300 to other components, for example a circuit board, such as a PCB (Printed Circuit Board).

The mold material 32 may be composed of any appropriate electrically insulating thermoplastic or thermosetting material, in one embodiment it may be composed of a material commonly used in contemporary semiconductor packaging technology. Various techniques may be employed to cover the components of the device 300 with the mold material 32, for example compression molding, injection molding, powder molding or liquid molding.

Before or after the encapsulation with the mold material 32, the individual devices 300 are separated from one another by separation of the leadframe, for example by sawing the dams. Afterwards, the leads 30 may be bent and/or trimmed as illustrated in FIG. 3I. Instead of having the leads 30 protruding from the mold material 32, it is also possible to have a leadless device 300.

It is obvious to a person skilled in the art that the devices 100, 200 and 300 as illustrated in FIGS. 1C, 2 and 3I are only intended to be exemplary embodiments, and many variations are possible. For example, it is possible to use metal particles 27 which have dimensions larger than 100 nm, for example in the range from 1 to 3 µm. These metal particles 27 may, for example, be made of AuSn or other metal alloys. They may also be coated by a layer 28 made of an organic or flux material and may be dispersed in a solvent 29. However, rather than being sintered these metal particles 27 may be melted when attached to the carrier 12. The temperature $T_2$ may be in the range from 300 to 500° C. and depends on the material of the metal particles 27. Furthermore, instead of using metal particles 27 any other appropriate solder material may be used to attach the semiconductor chip 10 with the bare semiconductor surface 21 to the carrier 12.

Another variation of the method illustrated in FIGS. 3A to 3I is to stack two or more semiconductor chips on top of each other and using the method described above for attaching the semiconductor chips to each other.

Instead of the leadframe other carriers having at least one electrically conductive surface may be used. A DBC (Direct Bonded Copper) substrate may, for example, be used as the carrier to carry the semiconductor chip. A DBC substrate is composed of a ceramic carrier with a sheet of copper bonded to one or both sides.

Figure 4A:
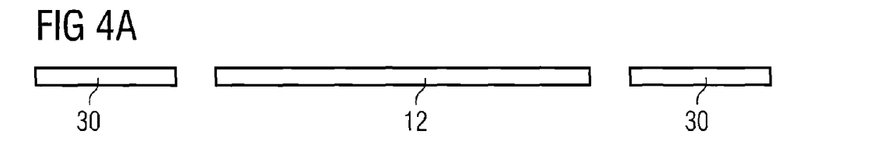
FIGS. 4A to 4H schematically illustrate a cross-sectional view of one embodiment of a method including depositing metal particles on a carrier and attaching a semiconductor chip to the carrier.
Figure 4B:
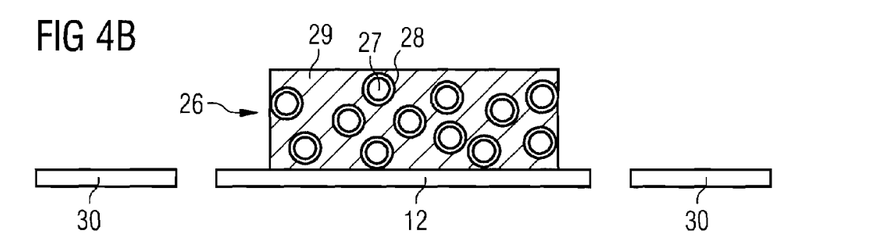
Figure 4C:
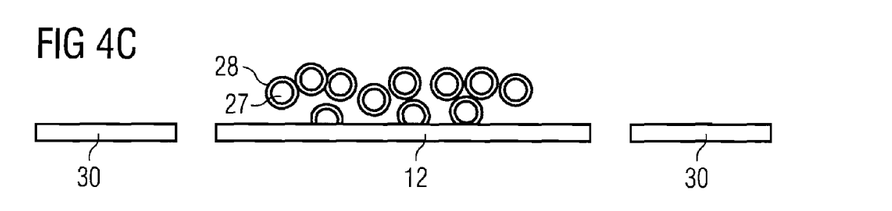
Figure 4D:
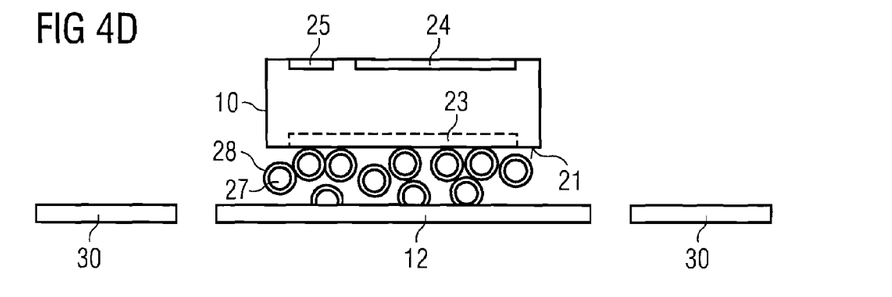
Figure 4E:
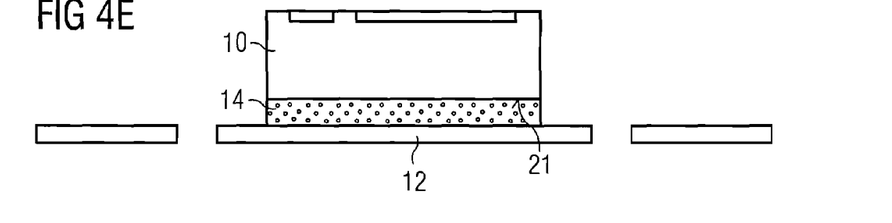
Figure 4F:
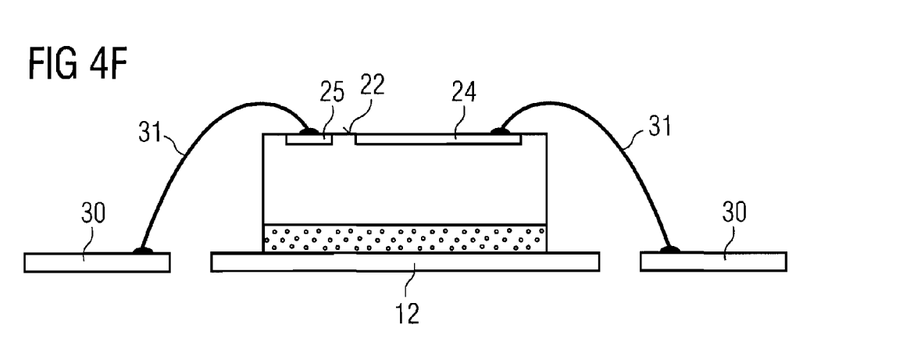
Figure 4G:
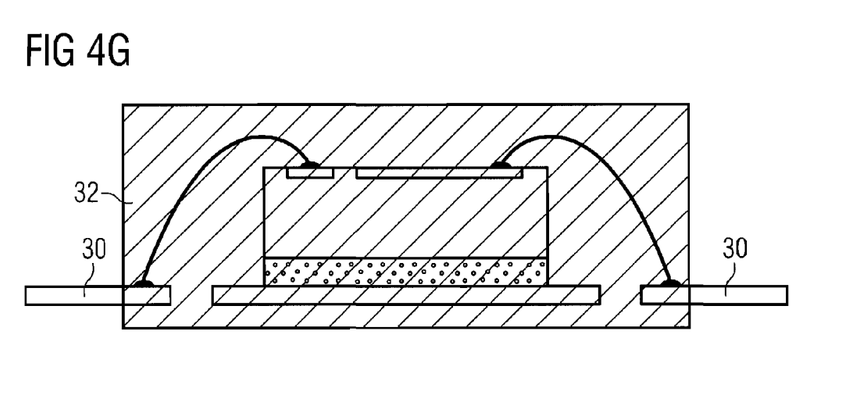
Figure 4H:
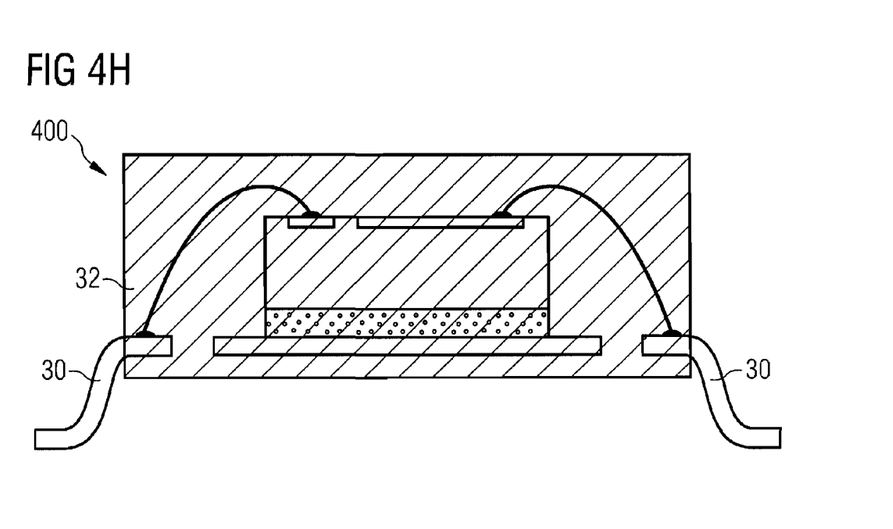

FIGS. 4A to 4H schematically illustrate a method for production of a device 400, a cross section of which is illustrated in FIG. 4H. The method illustrated in FIGS. 4A to 4H is similar or identical to the method of FIGS. 3A to 3I in many ways. In contrast to the method of FIGS. 3A to 3I, the paste 26 containing the metal particles 27 is deposited on the carrier 12 and not on the semiconductor wafer 20 according to the method of FIGS. 4A to 4H.

In FIG. 4A the leadframe including the carrier (die pad) 12 and the leads 30 is illustrated. The paste 26 containing the metal particles 27 dispersed in the solvent 29 may be applied to the upper surface of the carrier 12 as illustrated in FIG. 4B. The application of the paste 26 may be performed by stencil printing, other printing technologies or any other appropriate technique, for example dispensing or spin-coating metal particles 27 may include a layer 28.

After the application of the paste 26, the leadframe may be exposed to the temperature $T_1$ in an oven, which may be smaller than 150° C. The exposure time may be arbitrary, in one embodiment it may be long enough to allow the solvent 29 to at least partially evaporate leaving the metal particles 27 localized on the carrier 12 as illustrated in FIG. 4C. The solvent 29 may evaporate without any residues.

Then the semiconductor chip 10 may be placed over the metal particles 27 with the exposed semiconductor surface 21 facing the carrier 12. In order to have an oxide free first surface 21 so that an electrical contact can be established between the bare semiconductor electrode 23 (which is indicated in FIG. 4D by dashed lines) and the carrier 12 later on, any semiconductor oxide may be removed from the first surface 21 of the semiconductor chip 10 before placing the semiconductor chip 10 on the metal particles 27. Removing the semiconductor oxide may, for example, be carried out by dipping the semiconductor chip 10 into a HF solution or by plasma etching with a mixture of argon and hydrogen or any other appropriate etching method.

After the semiconductor chip 10 has been placed over the carrier 12, the same processes may be carried out as illustrated in FIGS. 3F to 3I and described above. As illustrated in FIG. 4E heat may be applied to expose the metal particles 27 to the temperature $T_2$ in order to produce the sintered metal layer 14. During the sintering process the semiconductor chip 10 may be pressed onto the carrier 12 for an appropriate time. Then electrical contacts between the electrodes 24 and 25 and the leads 30 may be established by bond wires 31 as illustrated in FIG. 4F. At least some of the components of the device 400 may be encapsulated with the mold material 32 as illustrated in FIG. 4G. The individual devices 400 may be separated from one another by separation of the leadframe, for example by sawing the dams. Afterwards, the leads 30 may be bent and/or trimmed as illustrated in FIG. 4H.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing a semiconductor chip with semiconductor material being exposed at a first surface of the semiconductor chip and electrodes, comprised of at least one of a group of gate, drain, or source electrodes, exposed on a second surface opposite the first surface;
   removing semiconductor oxide material from the first surface of the semiconductor chip;
   placing the semiconductor chip over a carrier with the first surface facing the carrier and electrically conductive material being arranged between the semiconductor chip and the carrier; and
   applying heat to attach the semiconductor chip to the carrier after removing the semiconductor oxide material and after placing the semiconductor chip over the carrier.

2. The method of claim 1, wherein the carrier has a first surface facing the first surface of the semiconductor chip and the first surface of the carrier is electrically conductive.

3. The method of claim 1, wherein the electrically conductive material is sintered when the heat is applied.

4. The method of claim 1, including heating the electrically conductive material to a temperature below the melting temperature of the electrically conductive material when the heat is applied.

5. The method of claim 1, wherein the electrically conductive material comprises metal particles.

6. The method of claim 5, wherein the metal particles are coated with an organic material or a flux material.

7. The method of claim 6, comprising removing the organic material or the flux material when the heat is applied.

8. The method of claim 5, wherein at least 50% of the metal particles have dimensions smaller than 100 nm.

9. The method of claim 1, comprising applying the electrically conductive material to the first surface of the semiconductor chip before the semiconductor chip is placed over the carrier.

10. The method of claim 1, comprising applying the electrically conductive material to the carrier before the semiconductor chip is placed over the carrier.

11. The method of claim 1, comprising applying pressure to the electrically conductive material when the heat is applied.

12. The method of claim 1, wherein the semiconductor chip has a first electrode on the first surface and a second electrode on a second surface opposite to the first surface.

13. A method, comprising:
    applying metal particles to a first surface of a semiconductor wafer at which semiconductor material is exposed;
    singulating the semiconductor wafer with the metal particles after applying the metal particles for obtaining a plurality of semiconductor chips, each of the plurality of semiconductor chips having an exposed second surface opposite the first surface and exposed side edges;
    placing at least one of the plurality of semiconductor chips over a carrier with the metal particles facing the carrier after singulating the semiconductor wafer; and
    heating the metal particles to attach the at least one semiconductor chip to the carrier after singulating the semiconductor wafer with the metal particles.

14. The method of claim 13, wherein the metal particles are coated with an organic material or a flux material.

15. The method of claim 14, comprising removing the organic material or the flux material when the metal particles are heated.

16. The method of claim 13, including sintering the metal particles.

17. The method of claim 13, including heating the metal particles to a temperature below the melting temperature of the metal particles.

18. The method of claim 13, wherein at least 50% of the metal particles have dimensions smaller than 100 nm.

19. A method, comprising:
    providing a semiconductor chip with semiconductor material being exposed at a first surface of the semiconductor chip;
    placing the semiconductor chip over a carrier with the first surface facing the carrier and metal particles being arranged between the semiconductor chip and the carrier, at least 50% of the metal particles having dimensions smaller than 50 nm; and
    sintering the metal particles.

20. The method of claim 1, wherein the first surface is doped with doping ions to produce electrodes.

* * * * *